(12) United States Patent
Trotter et al.

(10) Patent No.: US 6,885,330 B2
(45) Date of Patent: Apr. 26, 2005

(54) DATA CONVERTERS WITH TERNARY PULSE WIDTH MODULATION OUTPUT STAGES AND METHODS AND SYSTEMS USING THE SAME

(75) Inventors: Brian David Trotter, Austin, TX (US); Bruce Duewer, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 40 days.

(21) Appl. No.: 10/656,749

(22) Filed: Sep. 5, 2003

(65) Prior Publication Data

US 2005/0052304 A1 Mar. 10, 2005

(51) Int. Cl.$^7$ ............................................. H03M 1/82
(52) U.S. Cl. ........................ 341/152; 341/159; 341/145
(58) Field of Search ............................... 341/152, 143, 341/144, 145, 159; 330/10, 251

(56) References Cited

U.S. PATENT DOCUMENTS

| | | | | |
|---|---|---|---|---|
| 5,008,675 A | * | 4/1991 | Toyomaki | 341/152 |
| 5,990,735 A | * | 11/1999 | Sigmon et al. | 330/10 |
| 6,373,334 B1 | * | 4/2002 | Melanson | 330/10 |
| 6,529,074 B1 | * | 3/2003 | Melanson et al. | 330/251 |
| 6,593,806 B1 | * | 7/2003 | Melanson | 330/10 |
| 6,693,571 B2 | * | 2/2004 | Melanson et al. | 341/143 |

* cited by examiner

Primary Examiner—Michael Tokar
Assistant Examiner—John B. Nguyen
(74) Attorney, Agent, or Firm—Thompson & Knight LLP; James J. Murphy

(57) ABSTRACT

A pulse width modulator includes at least one input for receiving an input signal and pulse width modulation circuitry for generating a pulse width modulated stream and another pulse width modulated stream. The pulse width modulated stream and the another pulse width modulated stream are nominally out of phase and together represent the received input signal. A summer sums the pulse width modulated stream and the another pulse width modulated stream to generate an analog output signal.

23 Claims, 10 Drawing Sheets

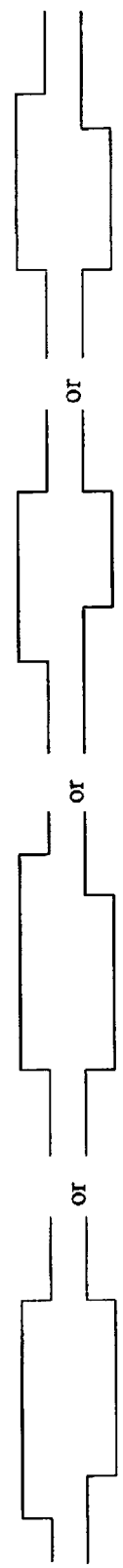
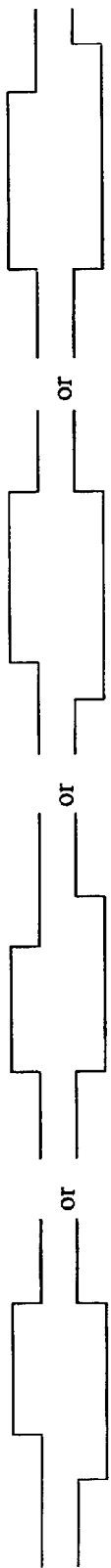
Figure 5A
Figure 5B
Figure 5C

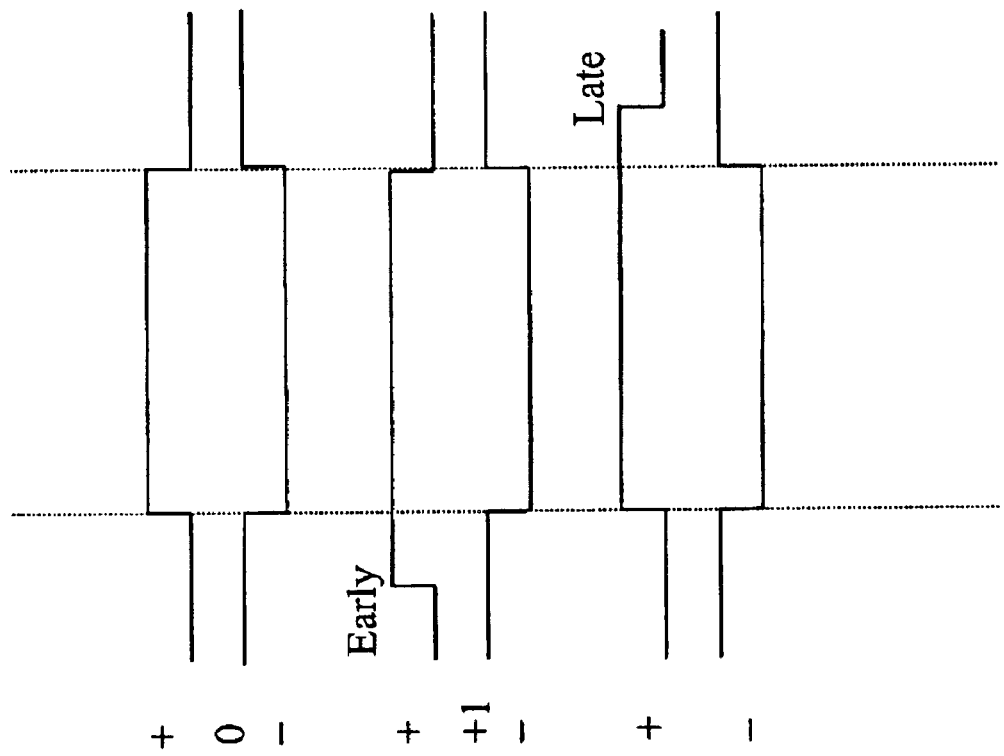

DATA CONVERTERS WITH TERNARY PULSE WIDTH MODULATION OUTPUT STAGES AND METHODS AND SYSTEMS USING THE SAME

CROSS REFERENCE TO RELATED APPLICATIONS

This application for patent is related to the following applications for patent: Pending U.S. patent application Ser. No. 10/306,598, filed Nov. 27, 2002 by inventor Melanson, entitled "DATA CONVERTERS WITH DIGITALLY FILTERED PULSE WIDTH MODULATION OUTPUT STAGES AND METHODS AND SYSTEMS USING THE SAME.

FIELD OF INVENTION

The present invention relates in general to delta-sigma data converters, and, in particular, to data converters with ternary pulse width modulation output stages and methods and systems using the same.

BACKGROUND OF INVENTION

Delta-sigma modulators are particularly useful in digital to analog and analog to digital converters (DACs and ADCs). Using oversampling, the delta-sigma modulator spreads the quantization noise power across the oversampling frequency band, which is typically much greater than the input signal bandwidth. Additionally, the delta-sigma modulator performs noise shaping by acting as a lowpass filter to the input signal and a highpass filter to the noise; most of the quantization noise power is thereby shifted out of the signal band.

The typical delta sigma modulator includes a summer summing the input signal with negative feedback, a loop filter, a quantizer, and a feedback loop coupling the quantizer output and the inverting input of the summer. In a first order modulator, the loop filter includes a single integrator or other filter stage while the loop filter in a higher order modulator has a cascade of a corresponding number of filter stages. Higher-order modulators have improved quantization noise transfer characteristics over those of lower order, but stability becomes a more critical design factor as the order increases. The quantizer can be either a one-bit or a multiple-bit quantizer.

In DAC applications, such as low out-of-band noise DACs, continuous-time output stages, such as current summers, which convert the quantized modulator output into a relatively smooth analog signal have a number of advantages over discrete-time output stages, such as switched capacitor output stages. For example, in DAC systems in which the modulator output is quantized into a large number of levels (e.g. sixty-four or more levels represented by eight or more bits), continuous-time output stages are relatively easy to design and construct. In addition, continuous-time output stages operating on a large number of quantization levels are relatively immune to jitter and the problem of sampling of far out-of-band energy. These advantages make continuous-time output stages the best choice for integration into large digital chips. With respect to smaller data converters and coder-decoders (Codecs), avoiding the sampling of high frequency energy allows for the simplification of the clock management scheme.

Despite their advantages, continuous-time output stages are also subject to significant drawbacks, such as a susceptibility to inter-symbol interference. (Inter-symbol interference or ISI in this case is usually caused by asymmetry in leading and trailing edges of the output signals from continuous time elements or from analog memory, in which each symbol is dependent on the prior one.) ISI can dominate the noise and distortion components in the output analog stream of a continuous-time data converter, even if a large number of continuous-time conversion elements operate on data samples with a large number of quantization levels. While ISI can be minimized using return to zero (RTZ) techniques, RTZ techniques generally cause increased circuit sensitivity to the characteristics of the controlling clocks.

Therefore, improved circuits and methods are required which allow continuous-time output stages to be utilized in such applications as DACs while minimizing ISI and at the same time reducing the effects of clock characteristics on circuit performance.

SUMMARY OF INVENTION

The principles of the present invention are generally embodied in pulse width modulation circuitry which converts an input stream into multiple output streams, and, which are nominally out of phase. In applications such as digital to analog converters, the multiple output streams from the pulse width modulator are then be summed to generate an analog output signal.

According to one particular embodiment of the invention, a pulse width modulator is disclosed which includes at least one input for receiving an input signal and pulse width modulation circuitry for generating a pulse width modulated stream and another pulse width modulated stream. The pulse width modulated stream and the another pulse width modulated stream are nominally out of phase. A summer sums the pulse modulated stream and the another pulse width modulated stream to generate an analog output signal.

The conversion of an input signal into multiple encoded output streams advantageously allows the resolution of the input stream to be increased without having to increase the modulator oversampling rate or the pulse width modulation clock. The addition of a mismatch shaper at the input to the multiple output pulse width modulator allows for the balancing of output pattern variations between the multiple PWM modulator outputs. The input to the multiple output PWM modulator stage may be from one of a number of different sources, including a digital source and/or the output of a delta sigma modulator quantizer. Furthermore, the principles of the present invention can be applied to a wide range of systems, including digital to analog converters, and in particular, continuous time digital to analog converters.

BRIEF DESCRIPTION OF DRAWINGS

For a more complete understanding of the present invention, and the advantages thereof, reference is now made to the following descriptions taken in conjunction with the accompanying drawings, in which:

FIGS. 5A–5C are diagrams of exemplary output patterns available from a multiple-output PWM stage embodying the present inventive principles; and FIGS. 6A–6C are diagrams illustrating exemplary techniques for generating the output patterns shown in FIG. 5A–5C.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1A:
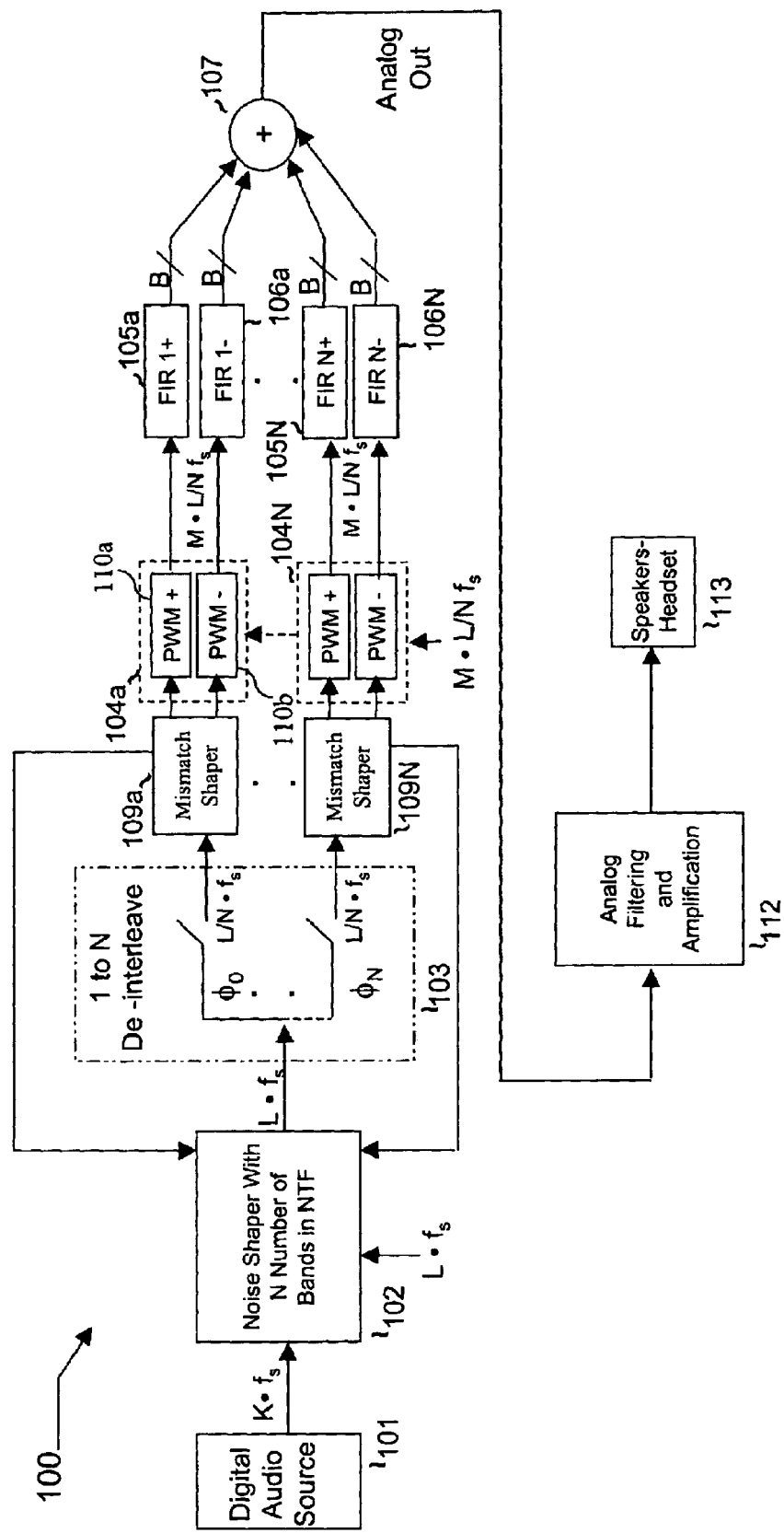
FIG. 1A is high level block diagram of an exemplary digital audio system including a digital to analog converter utilizing a delta-sigma modulator with multiple attenuation bands and de-interleaved pulse width modulators according to the inventive principles.

FIG. 1A is a high-level functional block diagram of an exemplary digital audio system 100 including an analog converter system suitable for demonstrating the principles of the present invention. For purposes of discussion, an audio application is described operating on digital audio from a source 101 such as a compact disk (CD) or digital versatile disk (DVD) player; however, the concepts described below can be utilized in a wide range of circuits and systems requiring digital to analog conversion. In system 100, the data output from digital source 101 is multiple-bit audio data having a base sampling frequency (rate) fs which is oversampled, for example in an interpolation filter, by an oversampling factor K. For example, in the illustrated embodiment the audio stream is output from digital audio source 101 with a base sampling frequency (fs) of 48 kHz with sixty-four times (64x) oversampling (i.e., K 64).

System 100 is based on a multiple-bit noise shaper 102 (e.g. delta sigma modulator) with multiple attenuation bands in the noise transfer function (NTF). Noise shaper 102 will be discussed in detail further below; however, generally the NTF includes one attenuation band for attenuating noise in the signal passband and additional attenuation bands for attenuating noise, which would otherwise be demodulated by any non-zero mismatch between the following finite impulse response (FIR) stages 105a–105N and 106a–106N discussed below.

Noise shaper 102 in the illustrated embodiment outputs multi-bit quantized samples at an oversampling frequency L·fs, in which L is the oversampling ratio of noise shaper 102. The modulation index (MI) of noise shaper 102 is preferably set to ensure that full scale output quantization levels are not output to the following ternary PWM stages 104. However, in alternate embodiments, in which some level of the ISI in the output stream is tolerable, full-scale quantization levels are utilized.

Each multiple-bit sample output from noise shaper 102 is de-de-interleaved by 1 to N de-interleave circuitry 103 into a corresponding one of a set of N parallel ternary PWM stages, in which N is an integer greater than or equal to 1. Ternary Pulse width modulator (PWM) stages 104a–105N will be discussed in detail below. Generally, each ternary PWM stage 104a–104N includes two outputs (+ and –), in contrast to the single output utilized in conventional PWM stages. Each of the ternary PWM stages 104a to 104N therefore effectively operates on input samples at a rate of L/N·fs.

In the illustrated embodiment, each ternary stage 104a–104N is represented by a pair of PWM encoders 110a and 110b, respectively labeled PWM+ and PWM–. Each PWM encoder 110a and 110b receives a quantized data stream from an associated mismatch shaper 109a–109N. Mismatch shapers 109a–109N distribute the input codes between encoders 110a–110b, as discussed below, and provide feedback to noise shaper 102. The principles of the present invention are not limited to embodiments in which each ternary PWM stage 104a–104N includes two PWM encoders 110a–110b. For example, an alternate embodiment of PWM stages 104a–104N including three or more PWM encoders 110 allows each PWM output pulse to be represented by three or more output patterns. An increase in the number of PWM output patterns in turn allows the number of level output from noise shaper 102 to be proportionately increased.

In the illustrated embodiment of system 100, each of ternary PWM stages 104a to 104N operates with an oversampling factor M and an oversampling clock signal at an oversampling frequency M·(L/N)fs. Each ternary PWM stage therefore outputs 2M number of N/(M·L) clock period long PWM patterns per each of representing (2M+1 levels) per sample received from de-interleave circuitry 103. In addition to the energy in the signal base band (approximately 0 to fs/2), each PWM stage 104a to 104N also outputs from each of two outputs significant energy at the fundamental frequency and harmonics of the PWM repeat rate of L/N·fs. Hence, each ternary PWM stage 104a to 104N output is followed by a digital-in, analog-out finite impulse response (FIR) filter with attenuation bands corresponding to these harmonics. Representative FIR filters 105a to 105N, 106a to 106N, in which filters 105a–105N filter the corresponding PWM+ outputs and filters 106a–106N filter the corresponding PWM– outputs are shown in FIG. 1A. The analog outputs from FIR filters are summed into output summer 106 to generate the analog output.

By this series of operations, system 100 ensures that the usage of all output elements 111a, . . . ,N of FIR filters 105a–105N and 106a–106N (discussed below) is approximately the same, as guaranteed by multiple NTF zeros of delta-sigma noise shapers 102, (also discussed further below). In alternate embodiments, other techniques, such as independent delta-sigma modulators, may be used. In addition, by this construction of system 100, the edge rate of all of the filter elements 111a, . . . ,N is also approximately equal. This result is due to a side effect of the fixed edge rate of combined delta-sigma modulators and pulse width modulators in general. Taken together, these two constraints remove much of the source for distortion in analog output stages.

Figure 1B:
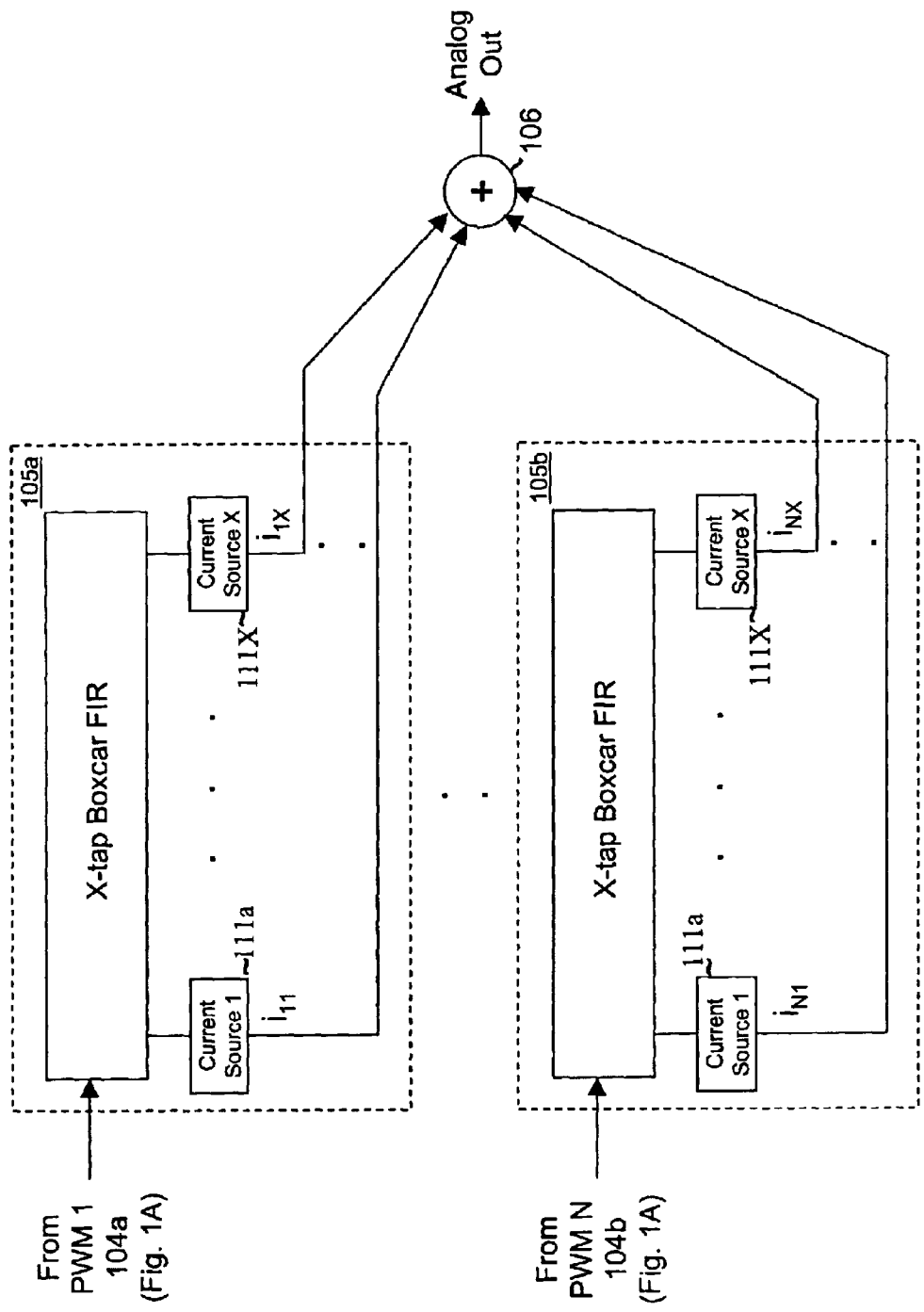
FIG. 1B is a more detailed block diagram of an exemplary digital-in, analog-out finite impulse response (FIR) filter suitable for use in the exemplary analog-in, digital-out FIR blocks shown In FIG. 1A.

FIG. 1B illustrates exemplary embodiments of digital-in, analog-out FIR filters 105a to 105N in further detail. The architecture of FIR filters 106a to 106N is the same. Each filter 105a to 105N includes a conventional FIR filter, such as a boxcar filter with simple coefficients, with X number of output taps. The length (number of stages) of each FIR filter 105a to 105N is greater than or equal to the width of the PWM pattern from the preceding PWM stage 104a to 104N, which introduces a notch in the filter output transfer function corresponding to the fundamental of the PWM repeat frequency. In other words, the length of each FIR filter 105a to 105N is proportional to the ratio of the output frequency of the FIR filter to the input frequency of the FIR filter. Longer FIR filters 105a to 105N (e.g. FIR filters with more stages) will attenuate more out of band energy at the cost of increased number of elements. An easy technique to significantly reduce out of band energy is to use FIR filters 105a to 105N with equal weights, with the number of taps equal to the PWM pattern length.

Each of the x number of filter taps, (in which x is an integer greater than one) is associated with a current source or similar single-bit digital to analog conversion elements, two of which are shown at 111a and for each filter 105a to 105N or 106a–106N. Current sources 111a, . . . ,N are of a simple constructions, such as a voltage source and a resistor or transistors operating in a constant current region or cascoded transistors. The outputs from current sources are either single-ended or differential sources. In the illustrated embodiment, output summer 107 includes a current to voltage converter when single-bit digital to analog conversion is performed by current sources 111a, . . . ,N. The currents can be equal, as in a boxcar filter, or unevenly weighted to improve the FIR filtering response. In alternate embodiments, filters other than boxcar FIR filters may be used. Advantageously, boxcar embodiments of FIR filter 105a to 105N and 106a to 106N, with equal taps are the simplest to implement and are adequate for most purposes.

In digital audio system 100 of FIG. 1A, the analog output signal generated by summer 107 Is subject to additional conventional analog filtering and amplification by analog filtering and amplification circuit block 112. A headset or set of speakers 113 provides the audible output.

Figure 2A:
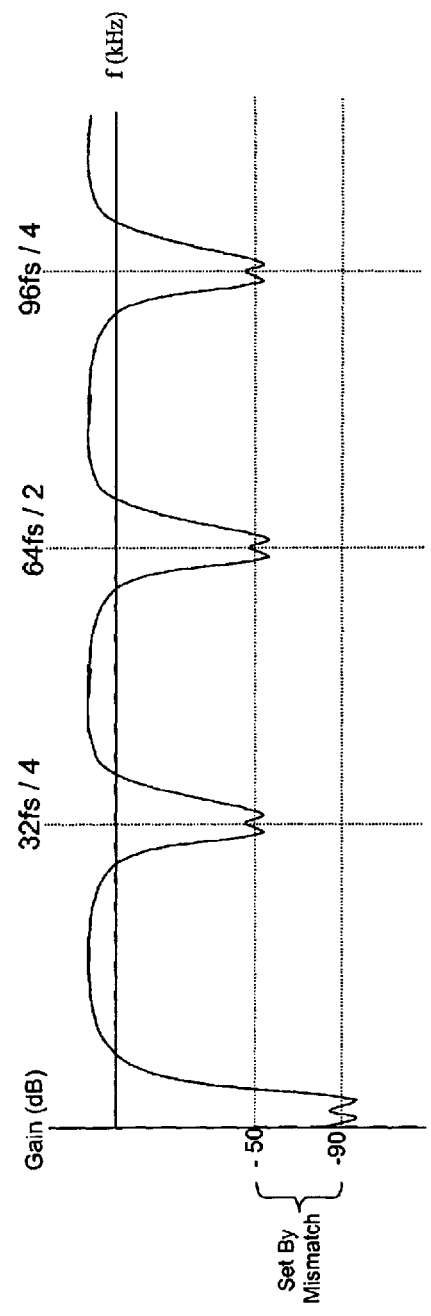
FIG. 2A is a gain versus frequency plot of the noise transfer function (NTF) of an exemplary delta-sigma modulator with four noise attenuation bands suitable for use in selected embodiments of the digital to analog converter of FIG. 1 utilizing four de-interleaved pulse width modulators.
Figure 2B:
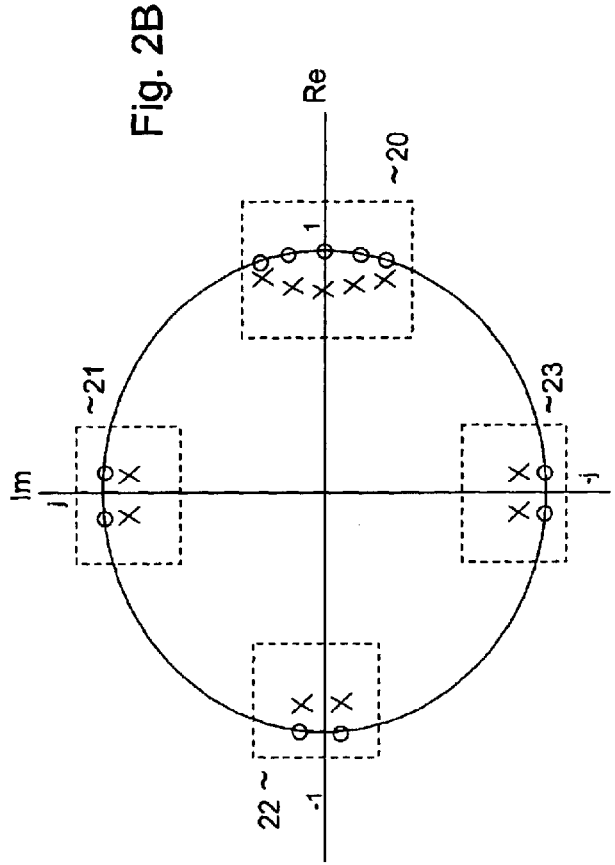
FIG. 2B is a plot in the z-plane of the poles and zeros of a delta-sigma modulator with multiple NTF noise attenuation bands corresponding to the noise attenuation bands shown in FIG. 2A.

The operation of noise shaper 102 for a by-four (i.e. N=4) de-interleaved system 100 is illustrated In FIGS. 2A and 2B. If N=4, noise shaper 102 outputs quantized samples that are split into four (4) sample streams each at a frequency of L·fs/4. In this example, noise shaper 102 outputs data samples at an oversampling frequency 128 fs, and de-interleave circuitry 103 therefore splits the noise shaped data stream into four streams, each at a frequency of 32 fs. Any mismatch between the following FIR filters 105a–105N and 106a–106N therefore demodulates the noise in the modulator bands 128·fs/4, 128·fs/2 and 128·3fs/4 (respectively 32 fs, 64 fs and 96 fs). Advantageously, the use of a PWM stage 104a to 104N In each output increases the effective matching accuracy of the following DAC elements, since the effect of the output mismatch is reduced by the number of slots in the PWM up-sampling.

As shown in FIG. 2A, the noise exposed to any non-zero mismatch between FIR filters 105a–105N and 106a–106N, is minimized by three additional attenuation bands included in the noise transfer function (NTF) of noise shaper 102 about the frequencies 32 fs, 64 fs and 96 fs along with the noise attenuation band at the signal baseband. The difference between the average level of attenuation in the signal band and the average level attenuation at the frequencies 32 fs, 64 fs, and 96 fs depends on the mismatch between the following PWM stages 104a to 104N. If more mismatch exists, then more modulator noise is demodulated in the frequencies bands about 32 fs, 64 fs and 96 fs, and the more attenuation in the modulator NTF around the frequencies 32 fs, 64 fs and 96 fs is required. However, an increase in attenuation at the frequencies 32 fs, 64 fs and 96 fs results in a decrease in attenuation in the signal band. (Generally, the area below the x-axis of FIG. 2A must equal the area above the x-axis.) Thus, a balancing must be made between the global noise shaping of the NTF across the modulator output frequency spectrum and local attenuation levels around 32 fs, 64 fs, and 96 fs.

An NTF in noise shaper 102 with a given difference between the average attenuation level in the signal band and the average attenuation about the frequencies 32 fs, 64 fs and 96 fs needs to be produced. A noise shaper topology which produces a one set of pole-zero pairs for setting the NTF signal band attenuation and sets of fewer poles about the frequencies 32 fs, 64 fs and 96 fs is required. A z-plane plot of the pole and zeros characterizing one such noise shaper is shown in FIG. 2B. In this example, an $11^{th}$ order noise shaper is characterized, which includes a first set 20 of five (5) pole-zero pairs that define the shape of the low frequency (signal band) noise attenuation of the NTF. In the illustrated embodiment, pole-zero pair set 20 includes four (4) pole-zero pairs at Butterworth locations and one (1) real pole-zero pair. Three additional sets 21, 22, and 23 of poles respectively define the shape of the noise attenuation bands about the frequencies 32 fs, 64 fs, and 96 fs. The number of poles and zeros in each set 20–23 may vary between embodiments, depending on the desired noise shaping and the tradeoff between the attenuation level in the NTF signal band and the attenuation levels in the 32 fs, 64 fs, and 96 fs frequency bands of the NTF. In FIG. 2B, the NTF zeros at 32 fs, 64 fs and 96 fs are split along the unit circle in the z-plane. In alternate embodiments, these zeros may remain un-split (co-located) to reduce the amount of hardware required to implement noise shaper 102.

Exemplary delta sigma modulator (noise shaper) topologies, which generate multiple attenuation bands in the NTF and which are suitable for use in noise shaper 102 are described in copending and coassigned patent application entitled "DELTA-SIGMA MODULATION CIRCUITS AND METHODS UTILIZING MULTIPLE NOISE ATTENUATION BANDS AND DATA CONVERTERS USING THE SAME" (U.S. Serial No. 0/191,016) incorporated herein by reference. For example, the z-plane pole-zero plot shown in FIG. 2B may be achieved by using the de-interleaved modulator topology 200 shown in FIGS. 2C and 2D, and discussed briefly below. Alternatively, a feed-forward design may be utilized having five filter stages with a transfer function of 1 $(1 - Z^{-1})$, and associated feedback loops, which place poles and zeros about the Z=0 point and a pair of filter stages with a transfer function of $1/(1-Z^{-4})$, and associated feedback loops, which place poles and zeros about the z-plane points Z=1, −1, j and −j. A feedback modulator may be used in other embodiments, although a feedback topology requires more precise coefficients and additional hardware. A general discussion of delta-sigma modulator topologies, including feedforward designs, is be found in publications such as Norsworthy et al., Delta-Sigma Data Converters, Theory, Design and Simulation, IEEE Press, 1996).

In exemplary modulator topology 200, shown in FIG. 2C, the local noise shaping at the frequencies fs/4 (z-plane point Re=0, Im=j), fs/2 (z-plane point Re=−1, Im=0) and 3 fs/4 (z-plane point Re=0, Im=−j) are implemented using four respective sets of independent loop filter stages 201a–201d, the outputs of which are de-interleaved in time by switch ("SW") 202 into the main noise shaping loop 209 discussed below. Each set of independent filter stages 201a–201d, shown in further detail in FIG. 2D, includes a pair of filter stages 203a and 203b, corresponding feedforward stages 204a and 204b with coefficients $C_1$ and $C_2$ for setting the local poles, and a feedback loop 205 (with one delay $Z^{-1}$ and gain g1') and summer 206 for setting the local zeros. (The structure of each independent filter stage 201a–201d may vary from a single filter stage 203 to three or more filter stages 203 and include more than one feedback loop, depending on the desired number and location of the local poles and zeros). The outputs from gain stages 204a–204b of independent loop filter stage 201a–201d are de-interleaved by a corresponding set of switches (SW) 207a–207b into the modulator output summer 208 of FIG. 2C.

Figure 2C:
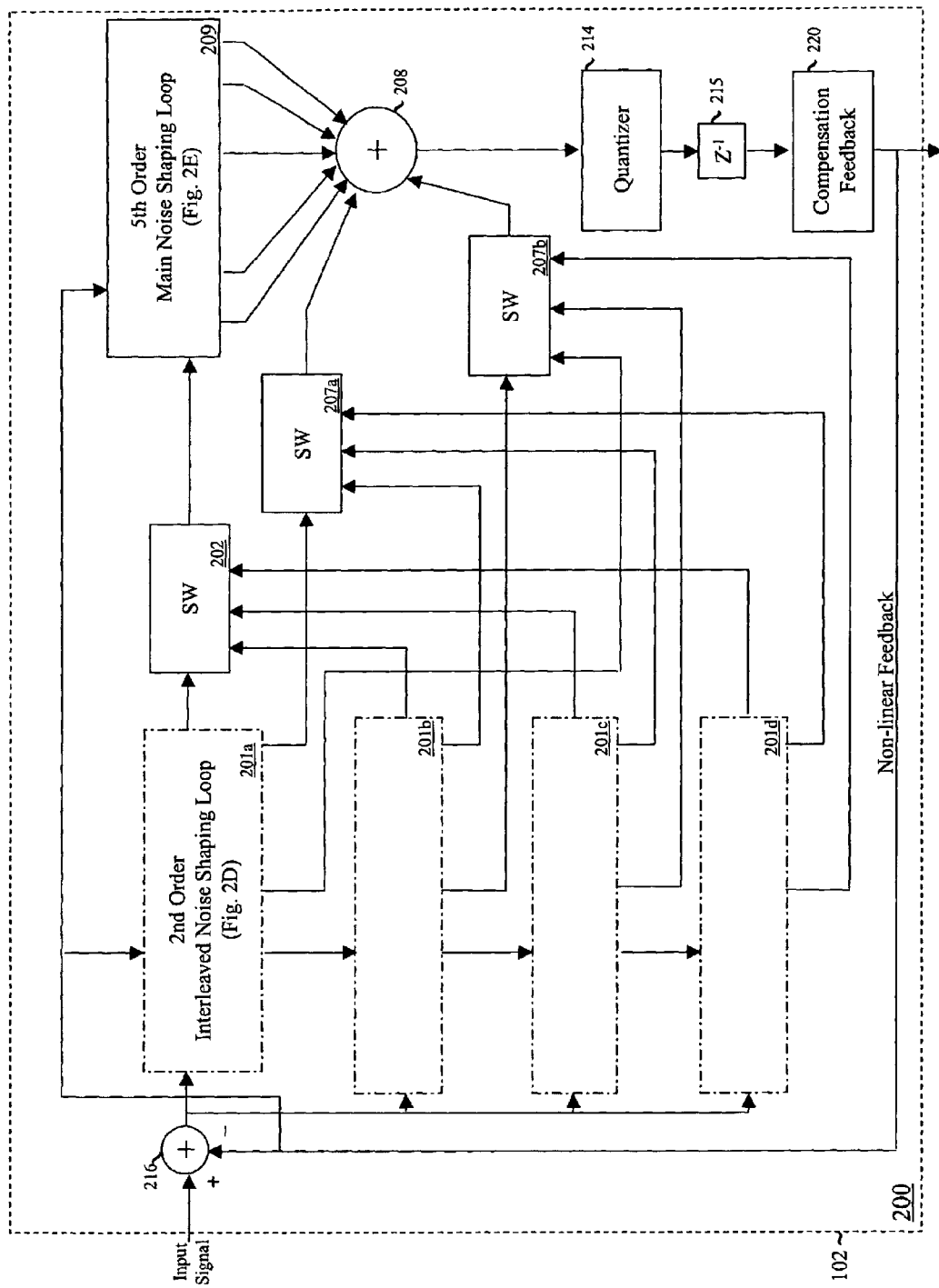
FIGS. 2C–2E are block diagrams of exemplary feedforward delta-sigma modulators suitable for producing the pole-zero placements shown in FIG. 2B.
Figure 2D:
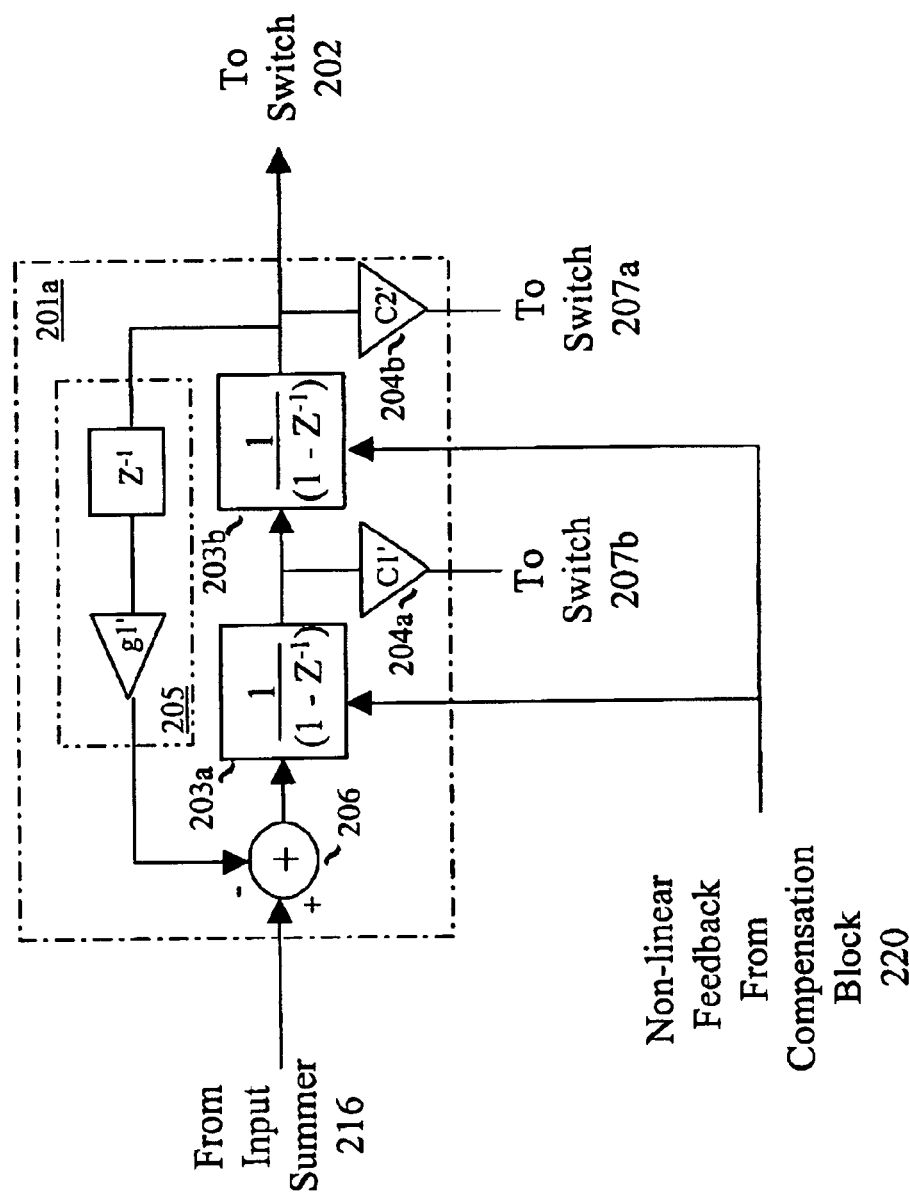

The global (baseband) noise shaping about DC ((direct current or zero frequency) (z-plane point Re=0, Im=0) is characterized by a fifth ($5^{th}$) order, main (shared) noise shaping loop 209 as shown in FIG. 2C. Main noise shaping loop 209 is shown in further detail in FIG. 2E and includes five (5) global filter stages 210a–210e and associated feedforward stages 211a–211e with respective coefficients $C_3$–$C_7$ feeding-forward into output summer 208 (see FIG. 2C). (The number and/or the Z-domain responses of global filter stages 210a–210e may also vary from embodiment to embodiment depending on the desired number and locations of the global pole-zero pairs in the NTF.) Feedback loops 212a–212b (including a gain of g2' and g2" and a delay $Z^{-1}$) and summers 213a–213b are shown for moving the global noise shaping zeros on the z-plane unit circuit away from the DC point (Re=1, Im=0).

While the energy of each PWM stage 104a to 104N generally tracks the input energy over time (e.g., the first integral of the output energy tracks the first integral of the input energy), apparent distortion in the PWM output occurs because the moments of the PWM output energy vary with different PWM patterns (e.g., the values of the second and higher order integrals of the PWM output energy do not track the values of the higher order integrals of the input energy). In particular, the location of the second or higher moment for a given PWM output pattern depends on the specific digital word being converted and the corresponding number of logic high and logic low slots in the pattern, as well as the distribution of those slots across the time period of the pattern. The distribution of the slots in each pattern is affected, for example, by the technique used to generate that pattern (e.g., grow right, grow left, etc.).

Figure 2E:
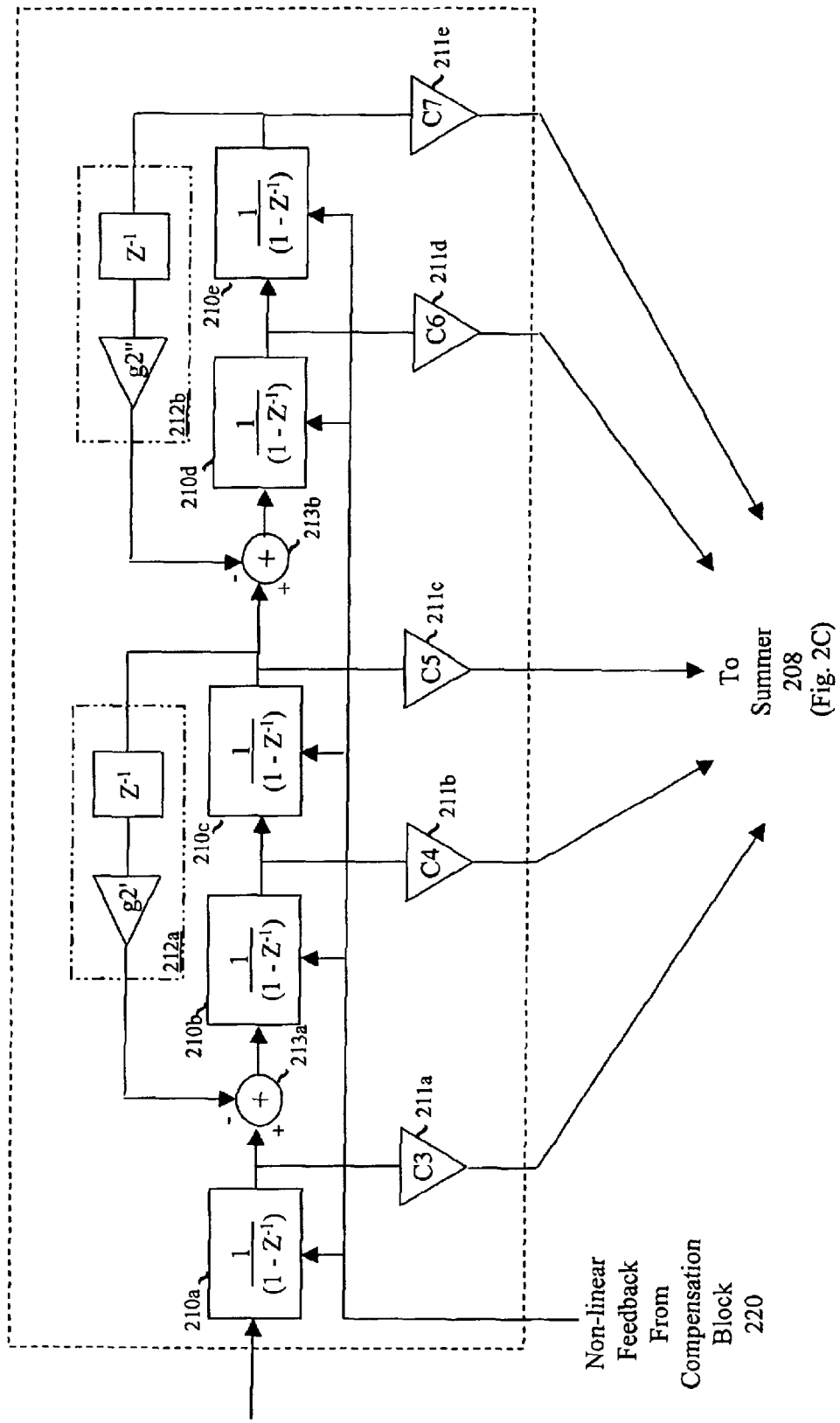

In delta-sigma modulator 102 of FIG. 2C, a feedback compensation block 220 is included at the output of quantizer 214 to provide nonlinear feedback to the integrator stages 203a–203b of second order loop filters 201 (see FIG. 2D) and/or integrator stages 210a–210e of fifth order loop filter 209 (see FIG. 2E). The nonlinear feedback provided by feedback compensation block 220 is described in incorporated U.S. Pat. Nos. 6,150,969 and 5,815,102, which were earlier cited and incorporated by reference. Generally, correction factors are fed back from feedback compensation block 220 to integrator stages 203a–203b and 210a–210b of delta-sigma modulator loop filters 201a to 201d and 209. By selectively correcting the inputs to the corresponding integrator stages, the moments of the data into the inputs of the following PWM stages 105a to 105N are varied. In turn, the moments of the PWM outputs are corrected to reduce distortion, which would otherwise result from time varying output energy moments. For example, to correct for variations in the second moment in a given PWM output pattern, nonlinear correction factors are fed back to at least the second integration stages of the delta-sigma modulator loop filters 201a to 201d and 209.

Returning to FIG. 2C, a multiple-level quantizer 214 and a delay element ($Z^{-1}$) 215 preferably generate the output of modulator 200. The resulting output signal is fed-back to the inverting input of the modulator-input summer 216 to close the delta-sigma loop. By de-interleaving between independent sets of filter stages 201a–201d, each set of filter stages 201a–201d is contributing to the input of summer 208 at one-quarter (¼) of the sampling rate fs at the modulator input. Consequently, the poles and zeros set by filter sets 201a–201d are translated to the z-plane points shown in FIG. 2B.

Continuing with the by-four de-interleaved (N=4) embodiment of the digital-to-analog converter of digital audio system 100 of FIG. 1, the four 32 fs quantized sample streams output from de-interleaving circuitry 103 are respectively passed to four PWM stages 104a to 104N. In this example, each PWM stage 104a to 104N performs an eight-times (8×) oversampling from a 256 fs oversampling clock signal (i.e. M=8). The resulting PWM encoded output pulse streams overlap in time, as shown in FIG. 3.

Figure 3:
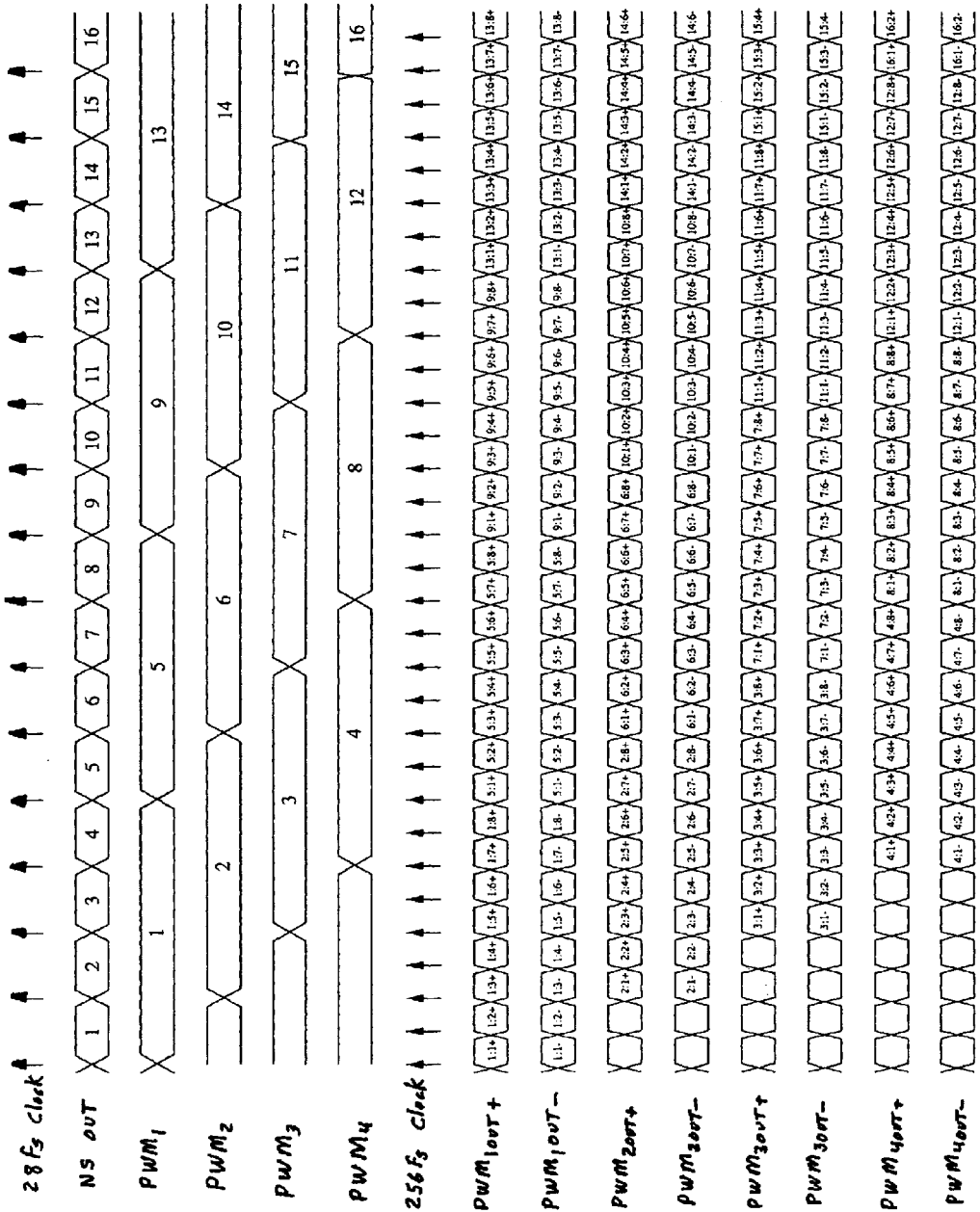
FIG. 3 is a timing diagram illustrating the signal timing of representative operations of the delta-sigma modulator and ternary pulse width modulators shown in FIG. 1 for the exemplary by-four de-interleaved pulse width modulator embodiment.
Figure 4:
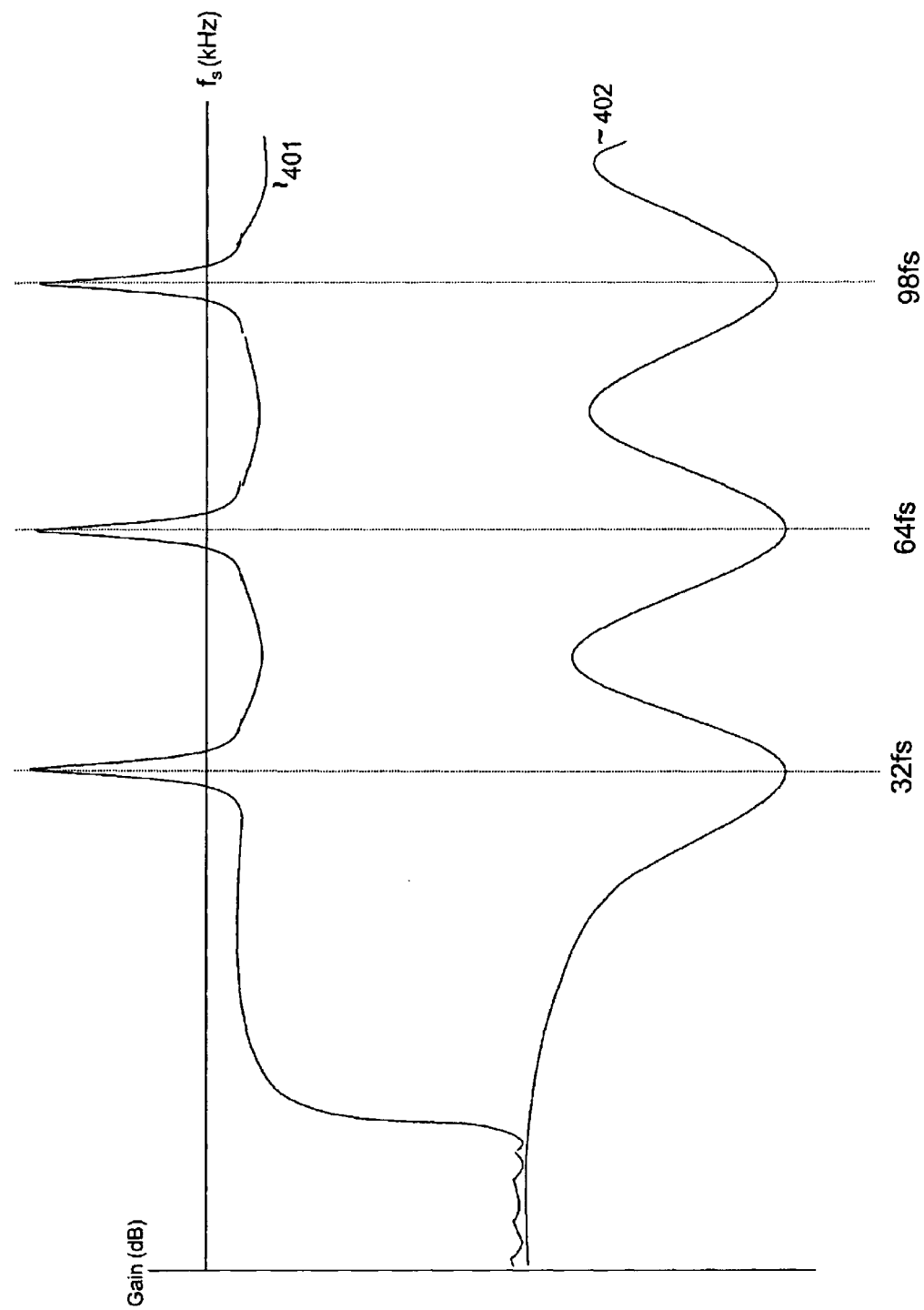
FIG. 4 is a gain versus frequency plot of the output of a selected one of the pulse width modulators of FIG. 1 for the exemplary by-four de-interleaved PWM and the response of the associated finite impulse response output filter.

FIG. 3 is a timing diagram depicting the conversion of an arbitrarily selected number of multiple-level quantized samples output from noise shaper 102 at the 128 fs oversampling frequency into multiple PWM streams at the 256 fs oversampling frequency. In FIG. 3, sixteen (16) representative bits or samples (1 –16) from the output of noise shaper 102 are shown by the trace labeled NSOUT. After a by-four interleave, each ternary PWM stage 104a to 104N operates on a new operand (sample) at the 32 fs rate as respectively shown by the overlapping streams labeled $PWM_1$, $PWM_2$, $PWM_3$, and $PWM_4$.

For an eight-times oversampling, each ternary PWM stage 104a to 104N encodes each corresponding sample received at the 32 fs oversampling frequency into two PWM encoded patterns (i.e. + and −), each corresponding to eight (8) periods of the 256 fs oversampling clock signal, as represented by the streams labeled $PWM_{1OUT+}$, $PWM_{1OUT-}$, $PWM_{2OUT+}$, $PWM_{2OUT-}$, $PWM_{3OUT+}$, $PWM_{3OUT-}$, $PWM_{4OUT+}$, and $PWM_{4OUT-}$ in FIG. 3. For example, the $PWM_{1OUT+}$ and $PWM_{1OUT-}$ streams together represent the output samples 1, 5, 9, and 13 from noise shaper 102, after by-four de-interleaving by de-interleaving circuitry 103 and eight-times oversampling by the corresponding PWM stages 104a to 104N.

The pairs of PWM encoded bitstreams $PWM_{1OUT+}$ and $PWM_{1OUT-}$, $PWM_{2OUT+}$ and $PWM_{2OUT-}$, $PWM_{3OUT+}$ and $PWM_{3OUT-}$, and $PWM_{4OUT+}$ and $PWM_{4OUT-}$, are offset in time by two periods of the 256 fs PWM oversampling clock (or equivalently one period of the 128 fs noise shaper oversampling clock). Each of these time-overlapped streams modulates energy in the signal baseband of approximately 0 to fs/2 along with significant energy at the harmonics of the repeat frequency 32 fs (e.g. 32 fs, 64 fs, 96 fs, and so on) as shown in trace 401 of the output gain versus frequency plot of FIG. 4. Consequently, each of the four ternary PWM stages 104a to 104N is associated with two output FIR filters 105a to 105N and 106a–106N with a response generally shown by trace 402 in FIG. 4. In particular, the response of each FIR filter 105a to 105N has notches about the harmonics of 32 fs corresponding to the peaks in the output response of the corresponding PWM stage 104a to 104N at the same frequencies. FIR response 402 is achieved, for example, by using 8 stage boxcar FIR filters with simple coefficients.

In an embodiment with four digital-in, analog-out FIR filters 105a to 105N and 106a–106N, each having a 8 stage boxcar filter, sixty-four analog outputs are provided into output summer 106. The sixty-four analog outputs overlap in time and are matched in usage and transition rate (transition density). The result is a continuous-time, analog output with minimal noise and distortion due to ISI. Advantageously, the structure is such that all DAC elements have the same edge rate and same duty cycle of use. To a significant degree, this advantage causes the cancellation of all distortion and noise products.

As shown in the example of FIG. 5A, each ternary PWM stage 104a–104N generates two PWM output patterns (+ and −) for each sample received from de-interleave circuitry 103 and the corresponding mismatch shaper 109a–109N. Advantageously, by encoding each input sample into two output patterns, the number of available PWM output levels per input sample is almost doubled, relative to conventional single-output PWM stages, without an increase in the PWM oversampling clock rate. For example, a conventional PWM encoder with a single output which encodes each input sample into an eight (8) slot wide PWM pattern, is limited to nine (9) possible output levels per output pattern corresponding to nine (9) possible input levels. In contrast, embodiments of PWM stages 104a–104N outputting two eight-slot patterns per input sample encode each input sample into an output pattern representing one of seventeen (17) possible levels. In turn, the input resolution (number of levels per input sample) into PWM stages 104a–104N may be increased to seventeen possible input levels to further increase the noise suppression provided by noise shaper 102.

The exemplary dual PWM output pattern signal shown in FIG. 5A represents a mid-level input value for purposes of the present discussion. In this case, the active slots of the each PWM output pattern are defined as the logic high level slots and the inactive slots as the logic low slots. Thus, for an embodiment in which each input sample is represented by two eight (8) slot wide PWM patterns, the midlevel PWM output value is represented by four (4) active slots and four (4) inactive slots. In the example shown in FIG. 5A, the + pattern includes two (2) inactive slots, followed by four (4) active slots and two (2) inactive slots while the − pattern includes two (2) active slots, followed by four (4) inactive slots and two (2) active slots. In other words, in the illustrated embodiment the + and − outputs for a midlevel input to a given PWM stage 104a–104N are nominally complementary waveforms which nominally sum to zero in analog summer 106. Other patterns representing the midlevel input level are possible in alternate embodiments.

As the input samples change, the PWM encoded output value (duty cycle) of one or both of the + and − output patterns changes (i.e. the number of active slots for the total output pattern represented by the + and − outputs increases or decreases such that the overall PWM encoded output value changes accordingly).

FIGS. 5B–5C demonstrate that a number of different techniques may be utilized for varying the output level (duty cycle) of a dual PWM output signal in response to a change in the input value. Generally, when the input value changes, either the +PWM output, the −PWM output, or both the + and −PWM outputs vary accordingly. Furthermore, for a given one of the + and − outputs, the output signal duty cycle may be varied by either varying the right or left edge of the output pattern relative to the mid-level pattern of FIG. 5A.

For odd-valued variations from the mid-level PWM pattern of FIG. 5A, one edge of one of the + or − patterns must differ from the other pattern by one active slot. However, if only the + output pattern or only the −PWM pattern is always varied for odd-valued input sample values, then distortion will result in the ultimate analog output due to mismatch between elements in filters 105a–105N and 106a–106N and summer 107. Therefore, mismatch shapers 109a–109N are included in digital audio system 100, as shown in FIG. 1, which, for odd inputs into PWM stages 104a–104N, unevenly split the input samples from de-interleave circuitry 103 into the following PWM encoders 110a and 110b and consequently distribute the output pattern variations between the + and − output patterns. For example, if the input value from de-interleave circuitry 103 represents an output level of +3, the current mismatch shaper 109a–109N may distribute an input value of +1 to PWM encoder 110a of the following PWM stage 104a–104N and an input value of +2 to the associated PWM encoder 110b. During the subsequent processing of the input data stream, the same mismatch shaper 109a–109N reverses the process for the next received input value representing an output level of +3 to that mismatch shaper 109a–109N, such that the corresponding PWM encoders 110a and 110b respectively receive +2 and +1 values.

For even-valued variations from the midlevel PWM pattern, active slots are added or subtracted from both the + and − output patterns to avoid mismatch. For example, to increase the overall PWM output level by +2, then the number of active slots for both the + and − output patterns is increased by +1. Specifically, the current mismatch shaper 109a–109N evenly splits the input value from de-interleave circuitry 103 into two equal values for input into the following PWM encoders 110 and −110b.

In addition to determining whether to vary the + or − output patterns, a determination must also be made as to the position in the selected pattern at which active slots are to be added or subtracted. For example, in a "grow left" scheme, the left edge of the pattern varies while in a "grow right" scheme the right edge of the pattern varies. In other words, an edge may be moved to be either early or late relative to its position at the midlevel reference position, as illustrated in FIGS. 6A–6C.

FIG. 6A shows the midlevel PWM output value as a reference. In FIGS. 6B and 6C, the +PWM output pattern (arbitrarily chosen for discussion purposes; the same process may alternatively be applied to the −PWM pattern) is increased by one (1) active slot to increase the overall output value by one (+1). In particular, in the case shown in the FIG. 6B, the additional active slot is added with the grow left technique such that the left edge of the + pattern is early with respects to the corresponding left edge in the reference midlevel + pattern of FIG. 6A In FIG. 6C, the additional active slot is added with the grow right technique such that the right edge of the + pattern is late with respects to corresponding edge in the reference midlevel + pattern of FIG. 6A Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modification or embodiments that fall within the true scope of the invention.

What is claimed is:

1. A pulse width modulator comprising:
    at least one input for receiving an input signal, wherein the at least one input comprises an input for receiving a first split of each value of the input signal and another input for receiving a second split of each value of the input signal;
    pulse width modulation circuitry including a pulse width modulation encoder for generating a pulse width modulated stream and another parallel pulse width modulation encoder for generating another pulse width modulated stream, the pulse width modulated stream and the another pulse width modulated stream being nominally out of phase and together representing the received input signal; and
    a summer for summing the pulse width modulated stream and the another pulse width modulated stream to generate an analog output signal.

2. The pulse width modulator of claim 1, wherein the pulse width modulation circuitry generates the stream and the another stream having equal duty cycles in response to a midlevel value of the input signal.

3. The pulse width modulator of claim 1, wherein the pulse width modulation circuitry generates the stream and the another stream with symmetrical waveforms in response to a midlevel value of the input signal.

4. A pulse width modulator comprising:
    at least one input for receiving an input signal, wherein the input signal comprises delta-sigma modulated data at a selected quantization level;
    pulse width modulation circuitry including a pulse width modulation encoder for generating a pulse width modulated stream and another parallel pulse width modulation encoder for generating another pulse width modulated stream, the pulse width modulated stream and the another pulse width modulated stream being nominally out of phase and together representing the received input signal; and
    a summer for summing the pulse width modulated stream and the another pulse width modulated stream to generate an analog output signal.

5. The pulse width modulator of claim 4, wherein the pulse width modulation circuitry generates the stream and the another stream having equal duty cycles in response to a midlevel value of the input signal.

6. The pulse width modulator of claim 4, wherein the pulse width modulation circuitry generates the stream and the another stream with symmetrical waveforms in response to a midlevel value of the input signal.

7. The pulse width modulator of claim 4, wherein the pulse width modulation circuitry comprises a pulse width modulation encoder and another parallel pulse width modulation encoder for generating the stream and the another stream.

8. A digital to analog converter comprising:
    a pulse width modulation stage for receiving a modulator input stream and outputting in response a duty cycle modulated stream and simultaneously another duty cycle modulated stream, the duty cycle modulated stream and the another duty cycle modulated stream being nominally out of phase;
    conversion circuitry for converting the duty cycle modulated stream and the another duty cycle modulated stream into an analog signal; and
    a mismatch shaper for selectively distributing variations in duty cycle between the duty cycle modulated stream and the another duty cycle modulated stream for odd values of the input stream.

9. The digital to analog converter of claim 8, wherein the conversion circuitry comprises:
    a finite impulse response filter for converting the duty cycle modulated stream into a plurality of filtered data streams;
    another finite impulse response filter for converting the another duty cycle modulated stream into another plurality of filtered data streams; and
    a summer for summing the plurality and the another plurality of filtered data streams into the analog signal.

10. The digital to analog converter of claim 8, further comprising a delta-sigma modulator for generating the modulator input stream, the delta-sigma modulator having a signal transfer function with multiple attenuation bands.

11. A digital to analog converter comprising:
    a pulse width modulation stage for receiving a modulator input stream and outputting in response a duty cycle modulated stream and simultaneously another duty cycle modulated stream, the duty cycle modulated stream and the another duty cycle modulated stream being nominally out of phase; and
    conversion circuitry for converting the duty cycle modulated stream and the another duty cycle modulated stream into an analog signal, wherein the conversion circuitry comprises:
    a finite impulse response filter for converting the duty cycle modulated stream into a plurality of filtered data streams;
    another finite impulse response filter for converting the another duty cycle modulated stream into another plurality of filtered data streams; and
    a summer for summing the plurality and the another plurality of filtered data streams into the analog signal.

12. The digital to analog converter of claim 11, wherein the plurality and the another plurality of filtered data streams comprise currents of selected weights.

13. A digital to analog converter comprising:
    a pulse width modulation stage for receiving a modulator input stream and outputting in response a duty cycle modulated stream and simultaneously another duty cycle modulated stream, the duty cycle modulated stream and the another duty cycle modulated stream being nominally out of phase; and
    conversion circuitry for converting the duty cycle modulated stream and the another duty cycle modulated stream into an analog signal; and
    a delta-sigma modulator for generating the modulator input stream in response to a received digital stream.

14. A digital to analog converter comprising:
    a pulse width modulation stage for receiving a modulator input stream and outputting in response a duty cycle modulated stream and simultaneously another duty cycle modulated stream, the duty cycle modulated stream and the another duty cycle modulated stream being nominally out of phase;
    conversion circuitry for converting the duty cycle modulated stream and the another duty cycle modulated stream into an analog signal,
    another pulse width modulation stage for receiving a modulator input stream and outputting in response a duty cycle modulated stream and simultaneously another duty cycle modulated stream to the conversion circuitry; and interleave circuitry for interleaving the single modulator input stream between inputs to the pulse width modulation stage and the another pulse width modulation stage.

15. The digital to analog converter of claim 14, further comprising a delta-sigma modulator for generating the modulator input stream, the delta-sigma modulator having a signal transfer function with multiple attenuation bands.

16. A method of duty cycle modulation comprising:

receiving input data representing an input value;

generating first and second nominally out of phase duty cycle modulated pulses having respective first and second duty cycles from the input data, the first and second duty cycles summed to generate an output signal corresponding to the input value; and noise shaping the input data prior to generating the first and second duty cycle pulses.

17. The method of claim 16, wherein the first and second duty cycles are substantially equal for a midlevel input value.

18. The method of claim 16, wherein the first and second duty cycle modulated pulses have complementary waveforms for a midlevel input value.

19. A method of duty cycle modulation comprising:

receiving input data representing an input value;

generating first and second nominally out of phase duty cycle modulated pulses having respective first and second duty cycles from the input data, the first and second duty cycles summed to generate an output signal corresponding to the input value; and switching the input data to a selected one of a set of pulse width modulation stages for generating the first and second duty cycle modulated pulses.

20. The method of claim 19, wherein the first and second duty cycles are substantially equal for a midlevel input value.

21. The method of claim 19, wherein the first and second duty cycle modulated waveforms for a midlevel input value.

22. A method of duty cycle modulation comprising:

receiving input data representing an input value;

generating first and second nominally out of phase duty cycle modulated pulses having respective first and second duly cycles from the input data, the first and second duty cycles summed to generate an output signal corresponding to the input value; and mismatch shaping by selecting a one of the first and second duty cycles to be varied for an odd input value.

23. A method of duty cycle modulation comprising:

receiving input data representing an input value;

generating first and second nominally out of phase duty cycle modulated pulses having respective first and second duty cycles from the input data, the first and second duty cycles summed to generate an output signal corresponding to the input value; and filtering the outputs of the first and second duty cycle modulated streams with first and second finite impulse response filters.

* * * * *

UNITED STATES PATENT AND TRADEMARK OFFICE
CERTIFICATE OF CORRECTION

PATENT NO. : 6,885,330 B2
DATED : April 26, 2005
INVENTOR(S) : Brian David Trotter, Bruce Duewer and John Laurence Melanson It is certified that error appears in the above-identified patent and that said Letters Patent is hereby corrected as shown below:

Column 3,
Line 53, "(i.e., K 64)" should read -- (i.e. K=64) --;

Column 5,
Line 53, "In" at the end of the line, should be -- in --;

Column 8,
Line 49, "PWM" (second occurrence) should not be superscripted;

Column 14,
Line 8, after "modulated" insert -- pulses have complementary --.

Signed and Sealed this

Thirtieth Day of August, 2005

JON W. DUDAS
*Director of the United States Patent and Trademark Office*